United States Patent [19]
Kraz

[11] Patent Number: 5,877,630
[45] Date of Patent: Mar. 2, 1999

[54] SYSTEM AND METHOD FOR PROTECTING AN ELECTRONIC DEVICE FROM ELECTROMAGNETIC RADIATION INTERFERENCE

[75] Inventor: Vladimir Kraz, Santa Cruz, Calif.

[73] Assignee: Credence Technologies, Inc., Santa Cruz, Calif.

[21] Appl. No.: 698,716

[22] Filed: Aug. 16, 1996

[51] Int. Cl.$^6$ .................................................. G01R 31/28
[52] U.S. Cl. ......................... 324/511; 324/628; 340/659; 340/600; 361/159
[58] Field of Search .................................. 324/500, 511, 324/555, 628, 627, 750, 527; 340/600, 635, 653, 654, 659; 361/159, 178; 371/25.1, 29.1

[56] References Cited

U.S. PATENT DOCUMENTS

| | | | |
|---|---|---|---|
| 4,091,818 | 5/1978 | Brownlee et al. | 607/9 |
| 4,646,065 | 2/1987 | Solomon | 340/511 |
| 5,187,657 | 2/1993 | Forbes | 364/413.06 |
| 5,197,468 | 3/1993 | Proctor et al. | 607/9 |
| 5,647,379 | 7/1997 | Meltzer | 128/897 |

OTHER PUBLICATIONS

Jeffrey L. Silberberg, "Electronic Medical Devices and EMI," *1995 Annual Reference Guide*, D–15 thru D–24, 1995.

*Primary Examiner*—Michael Brock
*Attorney, Agent, or Firm*—Gray Cary Ware & Freidenrich

[57] ABSTRACT

A system for protecting an electronic device from electromagnetic radiation is provided that receives electromagnetic radiation impinging on said electronic device, determines a value of a characteristic of said electromagnetic radiation, generates a testing signal when said value of said characteristics of said electromagnetic radiation is greater than a predetermined value, and tests said electronic device in response to said testing signal to determine if said electromagnetic radiation has affected said electronic device. A method for protecting an electronic device from electromagnetic radiation is also provided.

12 Claims, 5 Drawing Sheets

SYSTEM AND METHOD FOR PROTECTING AN ELECTRONIC DEVICE FROM ELECTROMAGNETIC RADIATION INTERFERENCE

BACKGROUND OF THE INVENTION

This invention relates generally to a system and method for detecting electromagnetic radiation interference and for protecting an electronic device from interference caused by the electromagnetic radiation.

Many electronic devices may be affected by radiation, especially electromagnetic radiation, because the electromagnetic radiation may disrupt the normal electrical signals within the electronic device. Electromagnetic radiation may be generated by a variety of devices, such as television transmitters, cellular telephones, florescent lights, and even computers. For some electronic devices, such as an electronic heart pacemaker for example, the interference of the electromagnetic radiation may be critical since the electronic device may stop functioning. A particular concern is a cellular phone within the immediate area of the pacemaker. Some electronic devices that emit electromagnetic radiation are themselves also affected adversely by electromagnetic radiation generated by other electronic devices.

The problem of electromagnetic radiation interference is especially a concern for electronic devices that affect the life of a person. For example, medical devices and flight avionics devices in an airplane may cause the death of a person if those devices malfunction. For example, if the flight avionics of an airplane malfunctions, the lives of the people on the airplane may be at risk. Thus, many electronic devices that cannot afford to be adversely affected by electromagnetic radiation.

Some conventional electromagnetic radiation detection systems, such as field strength detectors, can detect electromagnetic radiation in a particular area. These systems may be useful for ensuring that an electronic device does not emit more electromagnetic radiation than permitted by such governmental agencies as the Federal Communications Commission (FCC). These conventional systems are separate from the actual electronic device so that it is inconvenient to carry the electronic device as well as the detection system. In addition, while these field strength detectors detect electromagnetic radiation, they do not protect the electronic device from the interference caused by the electromagnetic radiation.

Thus, the conventional systems detect electromagnetic radiation in a particular area, but are not located within the electronic device and do not protect the electronic device from the interference caused by the electromagnetic radiation. Thus, there is a need for a system and method for detecting and protecting an electronic device from electromagnetic radiation interference which avoid these and other problems of known devices, and it is to this end that the present invention is directed.

SUMMARY OF THE INVENTION

The invention provides an electromagnetic radiation interference detection and protection system that is located within an electronic device that may be susceptible to electromagnetic radiation. In addition, the invention provides an electromagnetic detection and protection system that detects electromagnetic radiation, detects the effect that the electromagnetic radiation has on the device it is connected to, and may reset the electronic device if the electromagnetic radiation has interfered with the device.

In summary, the invention provides a system for protecting an electronic device from electromagnetic radiation that receives electromagnetic radiation impinging on said electronic device, determines a value of a characteristic of said electromagnetic radiation, generates a testing signal when said value of said characteristics of said electromagnetic radiation is greater than a predetermined value, and tests said electronic device in response to said testing signal to determine if said electromagnetic radiation has affected said electronic device. A method for protecting an electronic device from electromagnetic radiation is also provided.

DETAILED DESCRIPTION OF A PREFERRED EMBODIMENT

The invention is particularly applicable to a system and method for detecting and protecting against electromagnetic radiation interference in an electronic device having a processor. It is in this context that the invention will described. It will be appreciated, however, that the system and method in accordance with the invention has greater utility.

Figure 1:
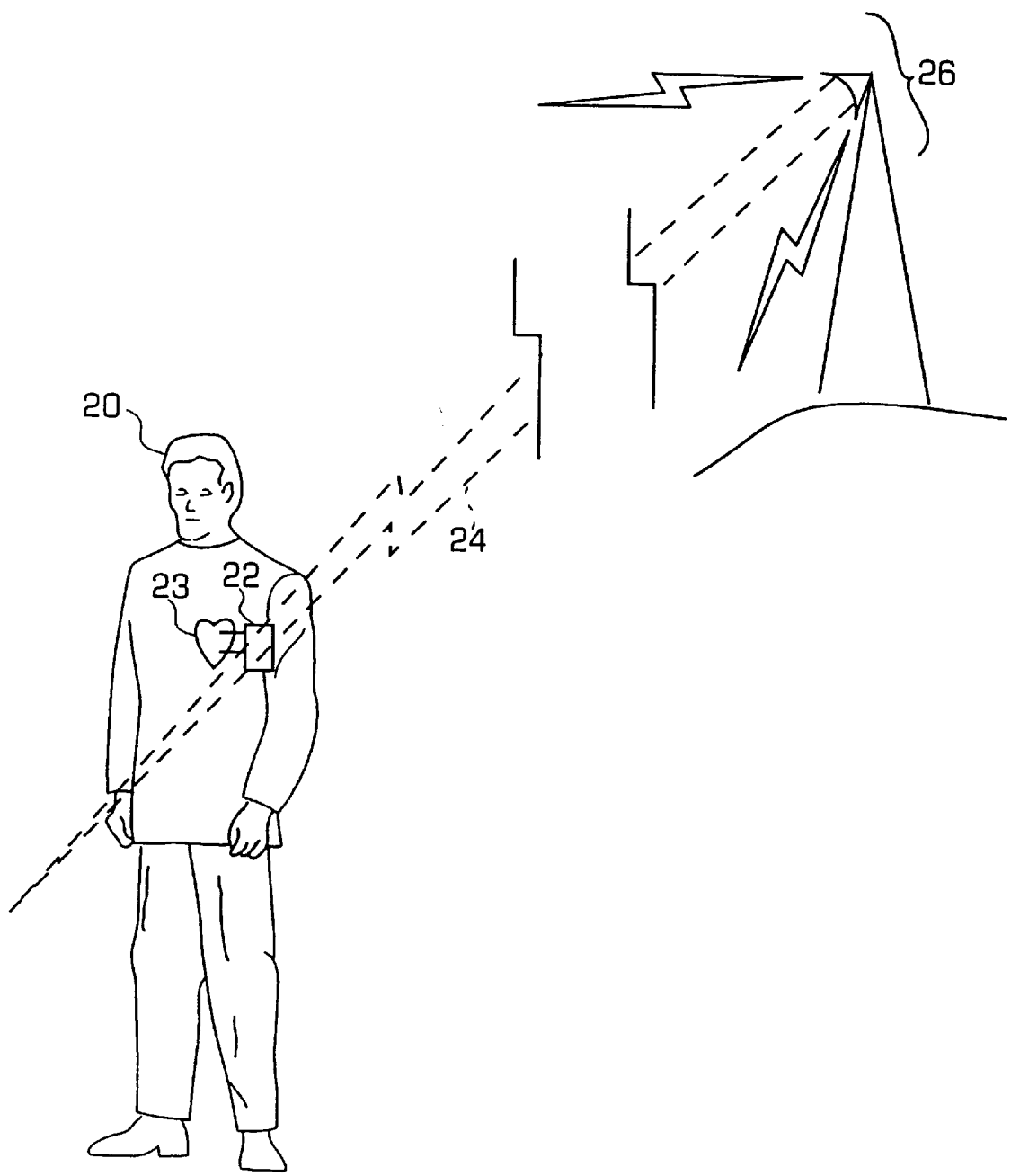
FIG. 1 is a diagrammatic view showing a person with an electronic pacemaker that is being interfered with by electromagnetic radiation from a television transmission tower.

FIG. 1 is a diagrammatic view showing a person 20 with an electronic medical device 22, such as a pacemaker, attached to his heart 23 that is being interfered with by electromagnetic radiation 24, such as from a television transmission tower 26. The pacemaker corrects a malfunctioning heart 23 by monitoring and adjusting the electrical signals that determine the speed at which the heart beats. It is critical that the pacemaker works correctly since the heart of the person may fail if the pacemaker fails. The pacemaker, which uses electrical signal to correct the speed of the heartbeat, may be interfered with by the electromagnetic radiation 24 from the transmission system 26, such as a television station tower. As shown, the transmission tower, located on a hill far away from the person, is generating electromagnetic radiation that travels great distances. Some of the electromagnetic radiation generated by the transmission tower may impinge on the electronic device 22, and may interfere with the operation of the pacemaker. The electromagnetic radiation that may affect the electronic device may have a broad frequency range of 1 kHz to 2.5 Ghz, for example, and electromagnetic radiation of these frequencies are generated by a radio station transmitter, an electrical power line, a cellular phone, a microwave relay station, a walkie-talker, and the like. Any modem system that uses some type of electromagnetic radiation to transmit or receive information may also generate electromagnetic radiation interference that may interfere with the operation of other electronic devices, such as the pacemaker. Now, the connection between the electronic device and the electromagnetic radiation interference detection and protection system will be described.

Figure 2:
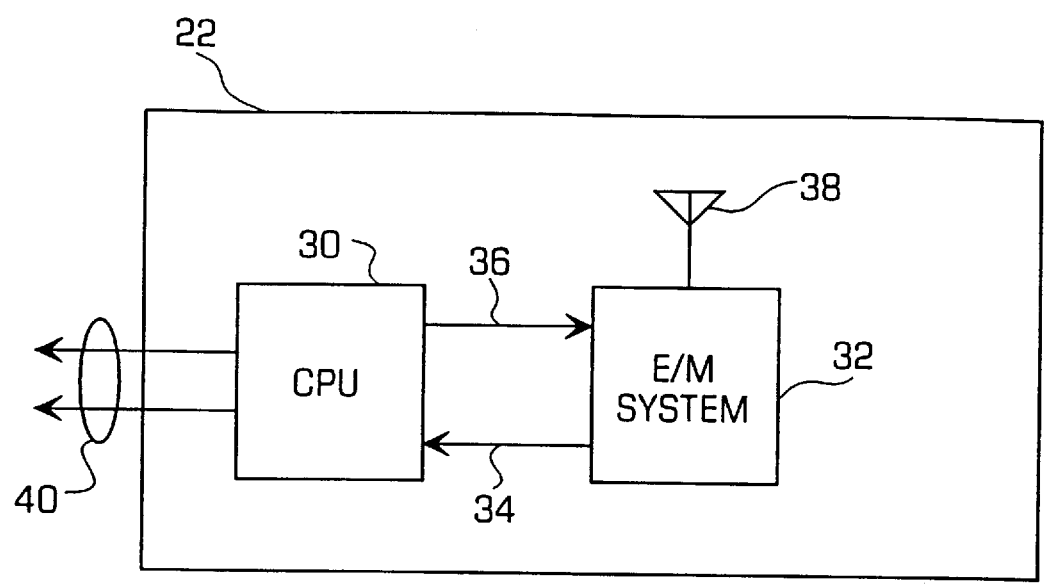
FIG. 2 is a enlarged diagrammatic view of an electromagnetic radiation interference detection and protection system in accordance with the invention that may be located within an electronic device, such as a pacemaker.

FIG. 2 is a enlarged diagrammatic view showing an electronic device 22 having an electromagnetic radiation interference detection and protection system in accordance with the invention located within the electronic device. As shown, the electronic device 22 may include a central processing unit (CPU) and an electromagnetic radiation protection and detection system (E/M system) 32. The electronic device may also have some other type of controller, such as a micro-controller, that may be protected from electromagnetic radiation in accordance with the invention. Briefly, the E/M system 32 generates testing signals in response to electromagnetic radiation that is detected and sends those testing signals to the CPU 30 over a first communications line 34. The E/M system then receives a response from the CPU to the testing signals over a second communications line 36. If the CPU does not respond to the testing signals, then it may be assumed the CPU has been affected and the E/M system generates an alarm signal. The operation of the CPU and E/M system will be described below in more detail. As described below in more detail, the E/M system may detect the electromagnetic radiation by using a receiving system 38, such as an antenna. The antenna and the E/M system preferably respond to and detect electromagnetic radiation having a frequency of between 1 kHz and 2.5 GHz. For the pacemaker shown, the CPU may control the speed of a person's heartbeat by stimulating signals provided by a pair of wires 40. Many different systems may be controlled by the CPU of the electronic device. Now, the E/M system will be described in more detail.

Figure 3:
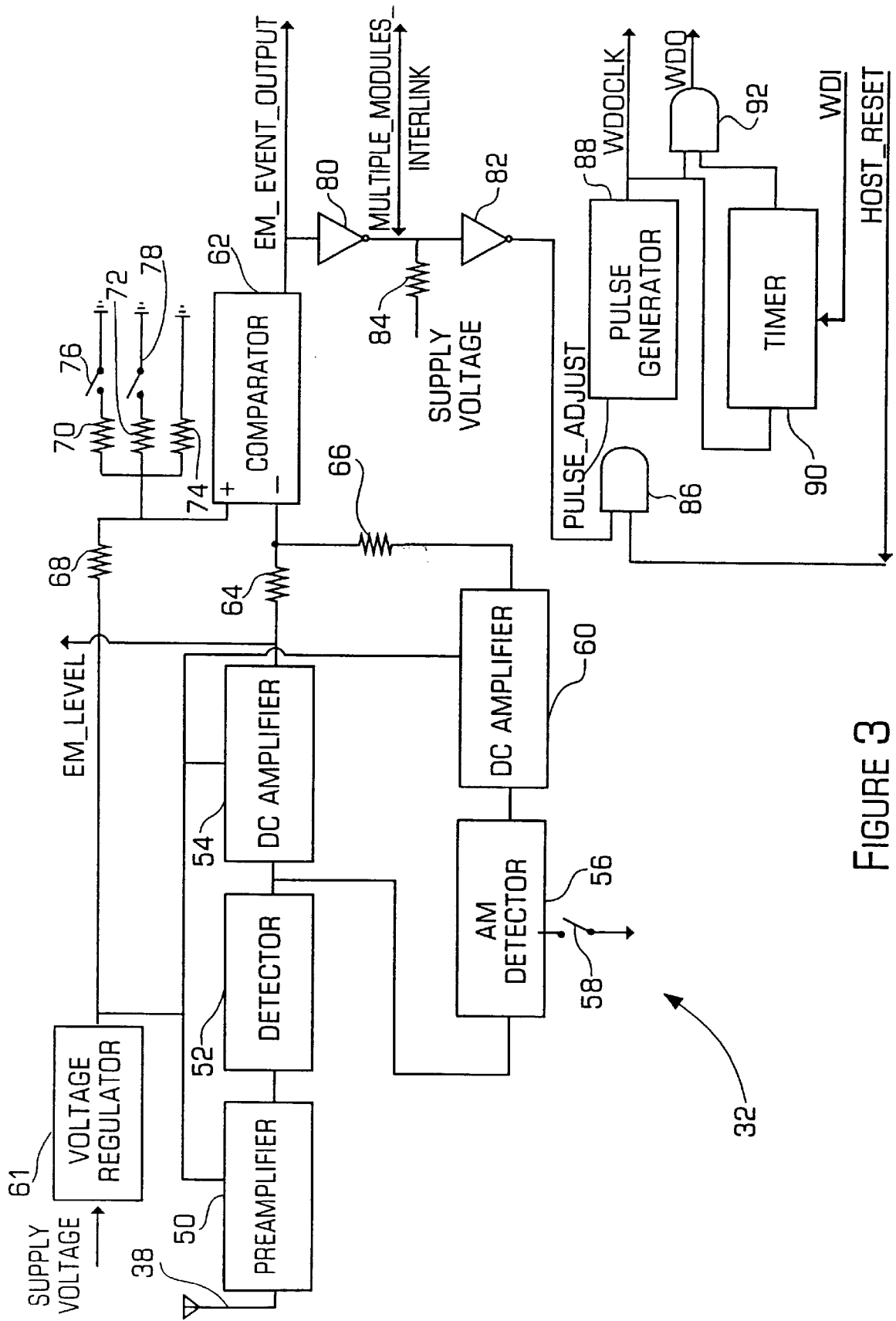
FIG. 3 is a block diagram of an electromagnetic radiation interference detection and protection system in accordance with the invention.

FIG. 3 is a block diagram of a preferred embodiment of the E/M system 32 formed with discrete components. The circuitry of the E/M system may also be integrated onto a single integrated circuit, such as an application specific integrated circuit (ASIC), or into a micromodule so that the E/M system may be fit into smaller products. Generally, the E/M system detects incoming electromagnetic radiation, and then protects the electronic device from the interference caused by the electromagnetic radiation.

To detect the electromagnetic radiation, the E/M system may have a receiving system 38, such as an antenna, that picks up any electromagnetic radiation in the form of an electromagnetic field and outputs an electrical signal corresponding to the electromagnetic field of the electromagnetic radiation. The size, shape and material of the antenna may be changed in order to detect different components of the electromagnetic field, such as the electric component or the magnetic component. The electrical output from the antenna may be fed into a preamplifier 50 that amplifies the electrical signals and may output the amplified signal to a detector 52. The detector may output a direct current (DC) voltage that is a representation of the electromagnetic field strength, as is known in the art.

The output of the detector may be fed into a first DC amplifier 54 and an amplitude modulation (AM) detector 56. The first DC amplifier amplifies the DC voltage output from the detector. The amplified DC voltage may be output as an EM_Level signal that may be used by systems external to the E/M system to monitor the continuous field strength of the electromagnetic radiation. If the field of the electromagnetic radiation varies in amplitude, then the EM_Level signal will also vary in amplitude. The AM detector 56 may detect the amplitude modulation of the electromagnetic field, and may output a DC signal representative of the amplitude modulation of the electromagnetic field. The AM detector may be disabled, if desired, by closing a switch 58 that grounds the AM detector. It is generally desirable to measure the amplitude modulation of the electromagnetic radiation, however, because steady electromagnetic radiation with a certain field strength may cause less interference than electromagnetic radiation with less field strength, but more amplitude modulation. Thus, in accordance with the invention, the field strength and amplitude modulation of electromagnetic radiation may be detected. The output of the AM detector may be connected to a second DC amplifier 60 that amplifies the signal representative of the amplitude modulation of the electromagnetic field.

To ensure a constant regulated voltage to all of the sensitive components of the E/M system, a supply voltage may be input to a voltage regulator 61 which outputs a regulated voltage to the preamplifier 50, the first DC amplifier 54, and second DC amplifier 60. The regulated voltage may also be supplied to a comparator 62, as described below.

The amplified output of the first amplifier 54, which represents the field strength of the electromagnetic field, may be fed through a resistor 64, to an inverting input of the comparator 62. The amplified output of the second amplifier 60, which represents the amplitude modulation of the electromagnetic field, may also be fed through a resistor 66 to the inverting input of the comparator. In this manner, the signal fed into the inverting input of the comparator is the sum of the DC representation of the field strength and the DC representation of the amount of amplitude modulation within the electromagnetic radiation. If the AM detector is disabled, then the signal at the inverting input of the comparator represents the field strength of the electromagnetic radiation. The non-inverting input of the comparator 62 may be connected to a regulated reference voltage from the voltage regulator 62 through a series of resistors 68–74. A first reference voltage switch 76 and a second reference voltage switch 78 may be used to adjust the reference voltage so that the comparator may be adjusted to trigger at different preselected levels. Thus, the level of the amplitude modulation and/or the field strength, combined or separately, needed to generate a testing signal, as described below, may be adjusted to account for electromagnetic radiation that may be generated by the electronic device. The selectable level also permits the E/M system in accordance with the invention to ignore electromagnetic radiation with amplitude modulations and/or field strength less than the selectable level. In addition, for more sensitive electronic devices, the comparator may trigger at lower levels of field strength and amplitude modulation. Adjusting the level of the trigger may also be used for electronic devices that themselves emit electromagnetic radiation.

The output of the comparator, EM_Event_Output, is a signal that provides an indication that the field strength and/or the amplitude modulation of the electromagnetic radiation has exceeded one of the preselected levels. This output may be used, by itself to signal a user of the electronic device that electromagnetic radiation of a sufficient level to trigger the detection device has been detected. The EM_Event_Output signal may also be used to trigger a protection system, that will now be described.

The protection system, in accordance with the invention, uses the EM_Event_Output signal to perform testing and resetting of the electronic device. The output of the comparator may be connected to a first buffer 80, a second buffer 82, and a pull-up resistor 84. These circuit elements may serve as a connection between several other modules over a Multiple_Modules_Interlink line, as described below. The output of the second buffer 82 may be connected to an input of a first logical AND gate 86. The second input of the first AND gate may be connected to a Host_Reset signal. The Host_Reset signal may be generated by the CPU of the electronic device. A high "1" signal on the Host_Reset line indicates that the CPU in normal operation mode. A low signal "0" on the Host_Reset line indicates that the CPU is currently in a reset mode and that the E/M system should not interrupt the reset sequence, as described below.

When there is a high signal "1" on the EM_Event_Output line, indicating that electromagnetic radiation has been detected that has a field strength and/or a amplitude modulation sufficient to trigger the comparator, and there is a high signal "1" on the Host_Reset line, indicating that the CPU is in a normal running mode, a high signal is generated at the output of the first AND gate. This causes a pulse generator 88 to begin generating pulses. The time interval between the pulses and the width of the pulses may be adjusted. A Pulse_Adjust line on the pulse generator may be used to adjust the repetition rate of the outgoing pulses in order to make the outgoing pulses compatible with different timing requirements for different CPUs. The generation of these pulses only occurs during a time when the detected electromagnetic radiation has an amplitude modulation and/or a field strength that are above on of the preselected levels, as described above. The output pulses may be sent to the CPU as a WDOCLK signal. The pulses may also be fed into a timer 90.

To test the CPU of an electronic device for interference from electromagnetic radiation, a signal may be sent to the CPU and then a response from the CPU is expected. If there is no response from the CPU, then it is assumed that the CPU has stopped functioning and needs to be reset. Therefore, in accordance with the invention, during a time when the detected electromagnetic radiation has an amplitude modulation and/or a field strength that are above a predetermined limit, the CPU is requested to respond to the pulses generated by the pulse generator over the WDI line. Each time the CPU responds, the timer is reset. If the CPU does not respond within a predetermined amount of time, such as two seconds, then the E/M system may take some actions. Thus, the timer 90 is started when the first pulse is generated and counts down until a signal on a WDI line indicates that the CPU is responding to the pulses. Thus, if the pulses are sent to the CPU and a signal is received back on the WDI line which resets the timer, then electromagnetic radiation is present, but it is not adversely affecting the CPU. If the CPU is adversely affected by the electromagnetic radiation, and the CPU locks up, for example, then the signals over the WDI line will stop so that the timer is not reset. Once the timer reaches zero, the timer outputs a signal that is fed into an input of a second AND gate 92. The other input of the second AND gate 92 is connected to the output of the pulse generator so that a WDO signal is only generated if the pulse generator is generating pulses and there is an output from the timer. The WDO signal may be used to sound an alarm or reset the processor. The timing of the various signals will be described in more detail below.

The Multiple_Modules_Interlink line may be used when more than one E/M system is installed within an electronic device. Thus, when each E/M system detects electromagnetic radiation within its area and outputs an EM_Event_Output signal, as described above. However, all of the EM_Event_Output signal may be connected together to a single, central pulse generator and timer so that only a single series of testing pulses is generated for any detection of electromagnetic radiation within the entire electronic device. Thus, the CPU only receives a single set of testing pulses. Multiple E/M systems may be used, for example, in a large system, such as an airplane, which may have multiple electronic device that require multiple E/M systems. Now, the detailed circuit schematic of the E/M system will be described.

Figure 4:
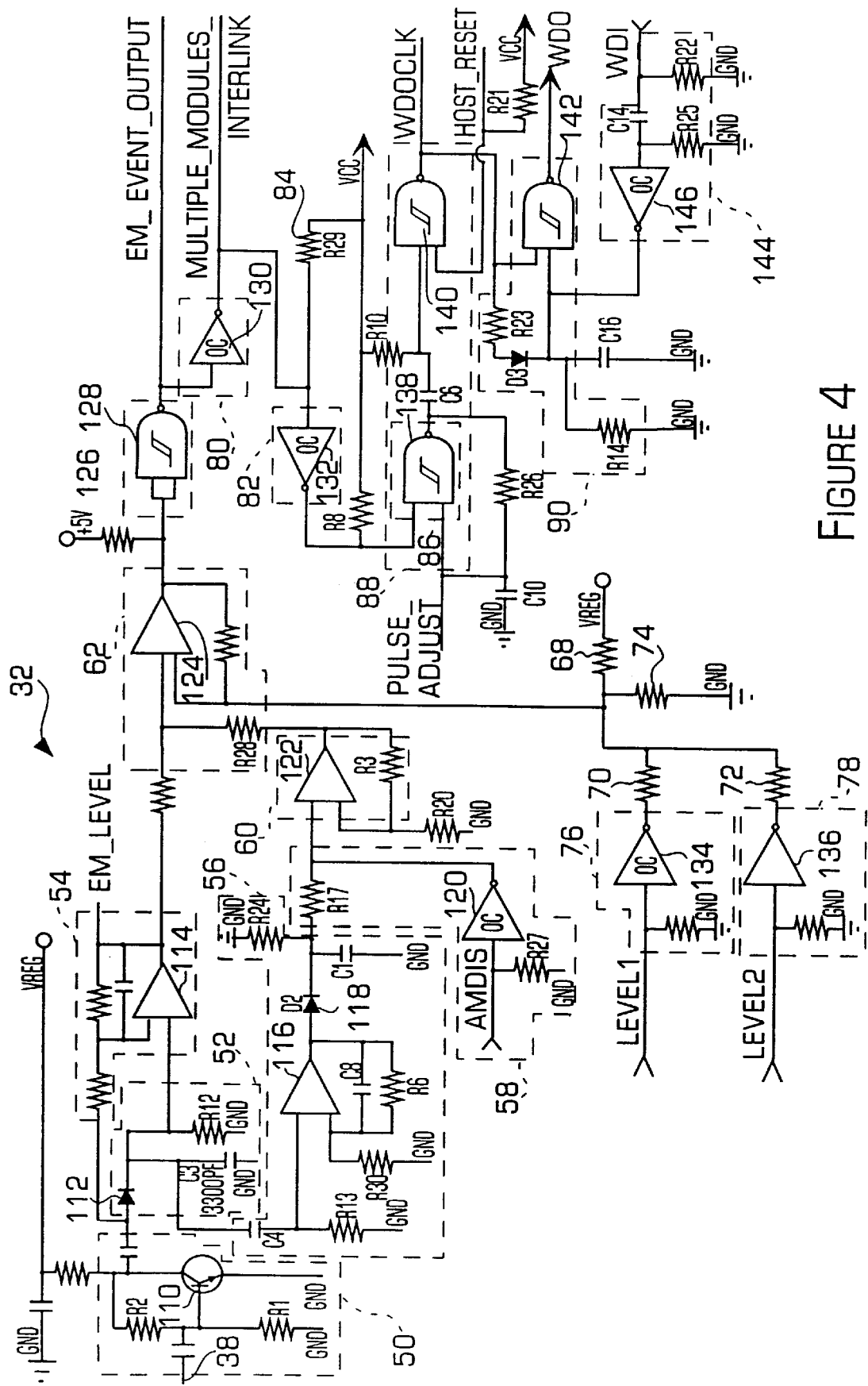
FIG. 4 is a circuit diagram of the electromagnetic radiation interference detection and protection system of FIG. 3.

FIG. 4 is a detailed circuit diagram of an E/M system in accordance with the invention. In the description, the resistors and capacitors will not be described. The preamplifier 50 may be a bipolar transistor 110 and a number of resistors for biasing the bipolar transistor and capacitors for blocking DC voltage. The bipolar transistor amplifies the incoming signal from the antenna 38. The detector 52 may be a diode 112 and various resistors and capacitors for detecting the field strength of the electromagnetic radiation from the amplified signal. The first amplifier 54 may be an operational amplifier 114. As described above, the amplified DC signal from the first amplifier may be output as a EM_Level signal and may be used for the purposes described above. The AM detector 56 may be an operational amplifier 116, and a diode 118 that detect the amplitude modulation of the electromagnetic radiation. The AM detector may be disabled by a switch 58 that may be an operational amplifier 120 that is activated by a AMDIS signal. The second amplifier 60 may built on an operational amplifier 122. The comparator 62 may also be an operational amplifier 124. In this embodiment, the switches 76, 78 that adjust the reference voltage and change the preselected level for triggering the comparator, are implemented by inverters with the open drain 134, 136. In this embodiment, there may be two preselected levels, LEVEL1 and LEVEL2.

To output the EM_Event_Output signal, a buffer 126 may be used since the comparator may not have sufficient output power. The buffer 126 may be an NAND gate 128 in which the signal is connected to both inputs. The first and second buffers 80, 82 may be implemented by inverters with the open drain 130, 132. In this embodiment, the AND gate 86 and the pulse generator 88 are implemented together as a pair of NAND gates 138 and 140. The timer may be implemented by an NAND gate 142. The WDI line may be processed by a filtering circuit 144 that passes only "0" to "1" transitions of the WDI signal rather than steady logic level signals, and the filtering circuit may be implemented as an inverter 146. Now, the operation of the electromagnetic radiation protection and detection system in accordance with the invention will be described.

Figure 5:
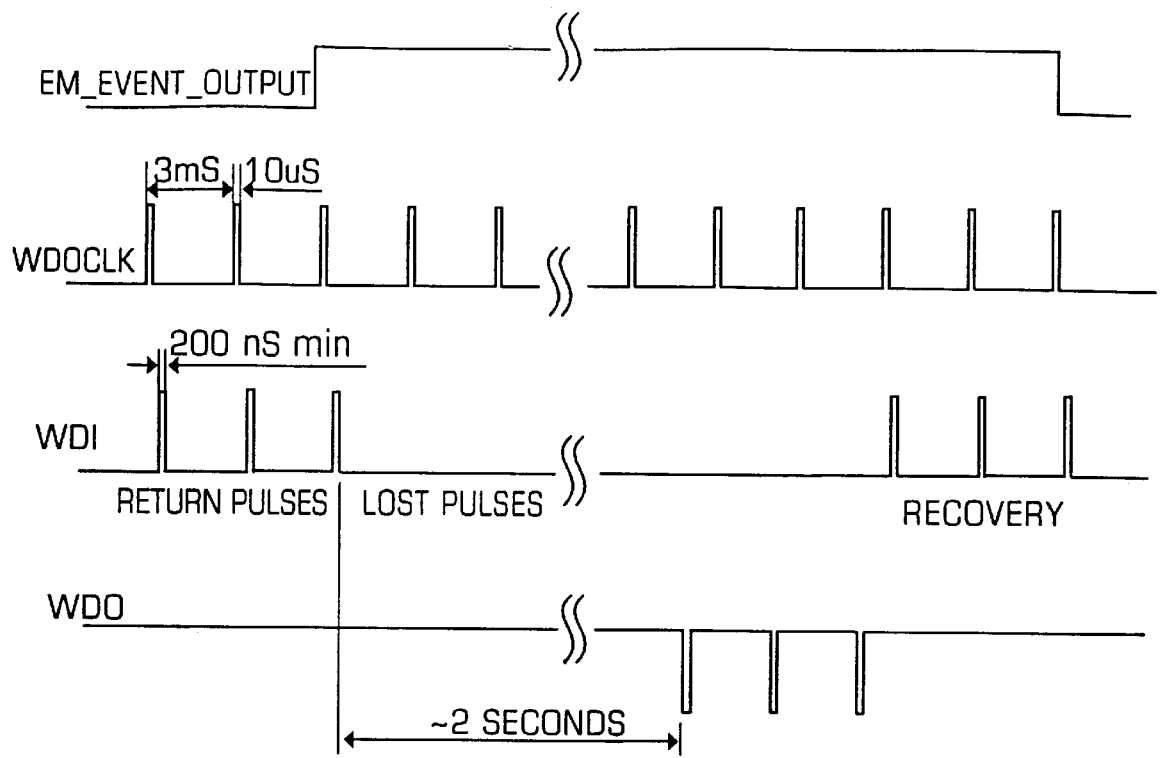
FIG. 5 is a timing diagram showing the signals generated by an electromagnetic radiation interference detection and protection system in accordance with the invention in response to electromagnetic radiation.

FIG. 5 is a timing diagram showing an example of the various signals within an E/M system in accordance with the invention in response to electromagnetic radiation. As described above, when electromagnetic radiation is detected that has a sufficient high level of field strength and/or amplitude modulation, the EM_Event_Output signal is raised high as shown. When either no electromagnetic radiation is detected or the detected electromagnetic radiation does not have a sufficiently high field strength and/or amplitude modulation level, the EM_Event_Output signal is low so that no pulses are generated on the WDOCLK line and the E/M system is in an inactive state. When the EM_Event_Output signal goes high, as described above, pulses are generated over the WDOCLK line that are sent to the CPU. In this example, the pulses may be 10 microseconds long and there may be 3 milliseconds between pulses.

As described above, the length and time period between pulses may be adjusted. As shown, the pulses on the WDOCLK line continue as long as the signal on the EM_Event_Output line is high.

As shown, when the CPU is unaffected by the electromagnetic radiation and returning the pulses, as described above, pulses are received by the E/M system on the WDI line that have the same width and time between pulses. In the example shown, the CPU becomes affected by the electromagnetic radiation and stops sending pulses over the WDI line. At this point, the timer counts down with each WDOCLK pulse that is not responded to until the timer reaches zero and a signal on the WDO line is sent to the CPU. The countdown time shown is about two seconds, but example, after the easily adjusted. In this example, after the pulses on the WDO line are sent several times, the CPU resets itself and begins again sending pulses on the WDI line in response to the pulses on the WDOCLK line. The pulses of the WDO line may actually reset the CPU, as shown, or provide an alarm signal to a system that may reset the CPU. Now, the operation of the E/M system in response to a Host_Reset signal will be described.

Figure 6:
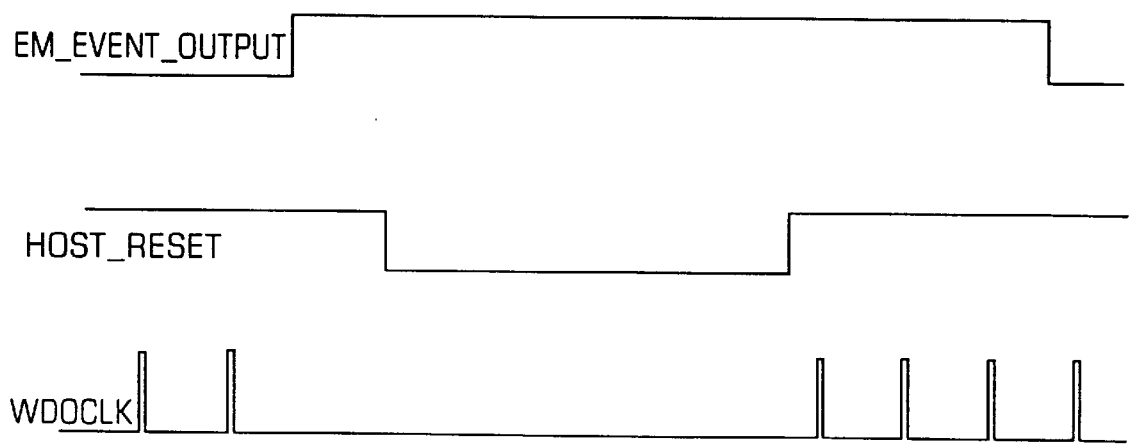
FIG. 6 is a timing diagram showing the signals generated by an electromagnetic radiation interference detection and protection system in accordance with the invention in response to a Host_Reset signal.

FIG. 6 is a timing diagram of an example of the signals generated by the E/M system in response to a signal over the Host_Reset line. As above, the signal on the EM_Event_Output line goes high when electromagnetic radiation of sufficient field strength and/or amplitude modulation has been detected. As described above, when the Host_Reset signal is high, the CPU is running in a normal mode and the E/M system is enabled to detect electromagnetic radiation interference. As shown, if the signal on the Host_Reset line is low, then the CPU is currently being reset and the E/M system is disabled, even if the signal on the EM_Event_Output line is high. During the period that the E/M system is disabled, no pulses on the WDOCLK line are generated. Then, once the CPU has been reset, the Host_Reset signal returns to a high state so that the E/M system is again enabled. Thus, the E/M system may be prevented from interrupting a reset procedure by the CPU.

While the foregoing has been with reference to a particular embodiment of the invention, it will be appreciated by those skilled in the art that changes in this embodiment may be made without departing from the principles and spirit of the invention, the scope of which is defined by the appended claims.

I claim:

1. A system for protecting an electronic device from electromagnetic radiation, comprising:

means for receiving electromagnetic radiation impinging on said electronic device;

means for determining a value equal to a field strength of said electromagnetic radiation;

means for determining a value equal to an amplitude modulation of said electromagnetic radiation;

means for combining the value of the field strength and the value of the amplitude modulation to generate a combined signal;

means for generating a start signal when the value of said combined signal is greater than a predetermined value; and means for testing said electronic device in response to said start signal to determine if said electromagnetic radiation has interfered with the operation of said electronic device.

2. The system of claim 1, wherein said electronic device malfunctions when it is interfered with by said electromagnetic radiation.

3. The system of claim 1, wherein said testing means comprises means for supplying a series of testing pulses in response to said start signal to said electronic device, the pulses being selected to cause the electronic device to produce a response, means for receiving return pulses from said electronic device produced in response to said series of testing pulses, and means for generating an alarm signal if said return pulses are not received by said testing means.

4. The system of claim 3 further comprising means for resetting a processor in response to said alarm signal.

5. The system of claim 4, wherein said testing means further comprises means for disabling the generation of the testing pulses when said processor is being reset.

6. The system of claim 1, wherein said predetermined value is adjustable.

7. The system of claim 6, wherein said means for determining the amplitude modulation comprises means for switching off said amplitude modulation determining means.

8. A method for protecting an electronic device from electromagnetic radiation, comprising:

receiving electromagnetic radiation impinging on said electronic device;

determining a value of the field strength of said electromagnetic radiation;

determining a value of the amplitude modulation of said electromagnetic radiation;

combining the value of the field strength and the value of the amplitude modulation to generate a combined signal;

generating a start signal when a value of the combined signal of said electromagnetic radiation is greater than a predetermined value; and testing said electronic device in response to said start signal to determine if said electromagnetic radiation has interfered with the operation of said electronic device.

9. The method of claim 8, wherein said electronic device malfunctions when it is interfered with by said electromagnetic radiation.

10. The method of claim 8, wherein testing said electronic device comprises generating a series of testing pulses in response to said start signal, said series of testing pulses being sent to said electronic device, receiving return pulses from said electronic device in response to said series of testing pulses, and generating an alarm signal if said return pulses are not received during testing.

11. The method of claim 10, further comprising disabling said generation of the testing pulses when said electronic device is being reset.

12. The method of claim 10 further comprising resetting a processor in the electronic device in response to said alarm signal.

* * * * *